United States Patent
Hsu et al.

(10) Patent No.: US 10,952,318 B2
(45) Date of Patent: Mar. 16, 2021

(54) METHOD FOR MANUFACTURING ELECTRONIC DEVICE

(71) Applicant: InnoLux Corporation, Miao-Li County (TW)

(72) Inventors: Po-Yun Hsu, Miao-Li County (TW); Ker-Yih Kao, Miao-Li County (TW); Chia-Ping Tseng, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/504,884

(22) Filed: Jul. 8, 2019

(65) Prior Publication Data

US 2020/0045816 A1 Feb. 6, 2020

(30) Foreign Application Priority Data

Aug. 3, 2018 (CN) .......................... 201810876651.5

(51) Int. Cl.
| | |
|---|---|
| *H01K 3/10* | (2006.01) |
| *H05K 1/03* | (2006.01) |
| *H05K 3/00* | (2006.01) |
| *H05K 1/05* | (2006.01) |

(52) U.S. Cl.
CPC ........... *H05K 1/036* (2013.01); *H05K 3/0017* (2013.01); *H05K 1/056* (2013.01); *Y10T 29/49165* (2015.01)

(58) Field of Classification Search
CPC ............. H01L 27/124; H01L 21/32139; H01L 27/14636; H01L 29/458; H01L 29/4908; H01L 51/5203; H01L 51/5225; H01L 21/0226; H01L 21/0273; H01L 21/31144; H01L 21/47573; H01L 27/1214; H01L 27/127; G02F 1/136227; G02F 1/1333; B32B 15/04; G09G 3/3648; Y10T 29/49165
USPC ............... 29/852, 592.1, 825, 829, 846, 847
See application file for complete search history.

(56) References Cited

U.S. PATENT DOCUMENTS

| | | | |
|---|---|---|---|
| 10,312,263 B2* | 6/2019 | Yeh ........................ H01L 27/124 |
| 2013/0083265 A1* | 4/2013 | Misaki .................. G02F 1/1368 |
| | | | 349/42 |

* cited by examiner

*Primary Examiner* — Thiem D Phan
(74) *Attorney, Agent, or Firm* — Muncy, Geissier, Olds and Lowe, P.C.

(57) ABSTRACT

An electronic device and a method for manufacturing the same are disclosed. The method for manufacturing the electronic device includes the following steps: providing a substrate; forming a metal layer on the substrate, wherein the metal layer has a first surface; forming a first insulating layer on the first surface of the metal layer; forming a second insulating layer on the first insulating layer; etching the first insulating layer and the second insulating layer to form a contact hole, wherein the contact hole exposes a portion of the first surface; cleaning the portion of the first surface exposed by the contact hole with a solution; and forming a transparent conductive layer on the second insulating layer, wherein the transparent conductive layer electrically connects with the metal layer.

11 Claims, 3 Drawing Sheets

METHOD FOR MANUFACTURING ELECTRONIC DEVICE

CROSS REFERENCE TO RELATED APPLICATION

This application claims the benefits of the Chinese Patent Application Serial Number 201810876651.5, filed on Aug. 3, 2018, the subject matter of which is incorporated herein by reference.

BACKGROUND

1. Field

The present disclosure relates to an electronic device and a method for manufacturing the same. More specifically, the present disclosure relates to an electronic device formed by an etching process and a method for manufacturing the same.

2. Description of Related Art

With continual advancements of the display technology, the trend of the development of display panels is toward compactness, small thicknesses, and light weight. This explains why the mainstream display devices on the market are thin and light displays. Thin and light displays have an extensive application scope, and we can see them in many of consumer electronics, such as mobile phones, laptops, video cameras, still cameras, music players, mobile navigators, TV sets, etc.

In the display device, an insulating layer has to be patterned to form a contact hole, and thus a transparent conductive layer on the insulating layer can electrically connects to a metal layer under an organic layer through the contact hole. However, when the insulating layer is patterned, residues may be adhered onto a surface of the metal layer or the metal layer exposed by the contact hole may be oxidized. When this situation occurred, the resistance between the transparent conductive layer and the metal layer is increased, or the peeling of the transparent conductive layer may be occurred.

Thus, it is desirable to improve the process for patterning the insulating layer to mitigate the aforesaid problems.

SUMMARY

The present disclosure provides a method for manufacturing an electronic device, which comprises the following steps: providing a substrate; forming a metal layer on the substrate, wherein the metal layer has a first surface; forming a first insulating layer on the first surface of the metal layer; forming a second insulating layer on the first insulating layer; etching the first insulating layer and the second insulating layer to form a contact hole, wherein the contact hole exposes a portion of the first surface; cleaning the portion of the first surface exposed by the contact hole with a solution; and forming a transparent conductive layer on the second insulating layer, wherein the transparent conductive layer electrically connects with the metal layer.

The present disclosure further provides an electronic device, which comprises: a substrate, a metal layer, a first insulating layer, a second insulating layer, a contact hole, a recess and a transparent conductive layer. The metal layer is disposed on the substrate and has a first surface. The first insulating layer is disposed on the first surface of the metal layer. The second insulating layer is disposed on the first insulating layer. The contact hole penetrates through the first insulating layer and the second insulating layer and exposes a portion of the first surface of the metal layer. The recess is adjacent to a boundary between the metal layer and the first insulating layer. The transparent conductive layer is disposed on the second insulating layer and electrically connects with the metal layer. Herein, a ratio of a length of the recess to a thickness of the transparent conductive layer is in a range from 0.01 to 0.2.

Other novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and/or effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the terms recited in the specification and the claims such as "above", "over", or "on" are intended not only directly contact with the other element, but also intended indirectly contact with the other element. Similarly, the terms recited in the specification and the claims such as "below", or "under" are intended not only directly contact with the other element but also intended indirectly contact with the other element.

Furthermore, the terms recited in the specification and the claims such as "connect" is intended not only directly connect with other element, but also intended indirectly connect and electrically connect with other element.

Furthermore, when a value is in a range from a first value to a second value, the value can be the first value, the second value, or another value between the first value and the second value.

In addition, the features in different embodiments of the present disclosure can be combined with one another to form another embodiment.

Figure 1A:
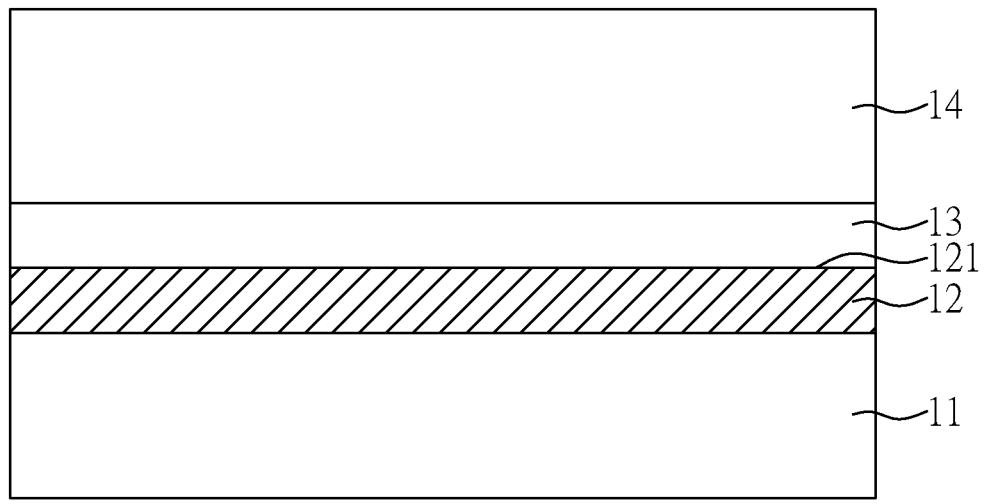
FIG. 1A to FIG. 1D are cross-sectional views showing a process for manufacturing an electronic device according to an embodiment of the present disclosure.

FIG. 1A to FIG. 1D are cross-sectional views showing a process for manufacturing an electronic device according to an embodiment of the present disclosure. As shown in FIG. 1A, in the method for manufacturing the electronic device of the present embodiment, a substrate 11 is firstly provided. The substrate 11 can be, for example, a quartz substrate, a glass substrate, a silicon wafer or a sapphire substrate. Alternatively, the substrate 11 can be, for example, a flexible substrate or a film, and the material of which can comprise, for example, polycarbonate (PC), polyimide (PI), polypropylene (PP), polyethylene terephthalate (PET), or other plastic or polymer material, but is not limited thereto.

Next, a metal layer 12 is formed on the substrate 11, wherein the metal layer 12 has a first surface 121. The material of the metal layer 12 may comprise: Cu, Ag, Al, Mo, W, Au, Cr, Ni, Pt, Ti, Cu alloy, Al alloy, Mo alloy, W alloy, Au alloy, Cr alloy, Ni alloy, Pt alloy, Ti alloy or other suitable metal. In some embodiments, the metal layer 12 may have a laminated structure, such as a Mo/Al/Mo laminated structure, a Ti/Al laminated structure or other suitable laminated structure. In one embodiment of the present disclosure, the material of the metal layer 12 comprises Cu or Cu alloy. In another embodiment of the present disclosure, the material of the metal layer 12 comprises Cu. However, the present disclosure is not limited thereto.

Then, a first insulating layer 13 is formed on the first surface 121 of the metal layer 12, and a second insulating layer 14 is formed on the first insulating layer 13. The material of the first insulating layer 13 may comprise: silicon oxide, silicon nitride, silicon oxynitride, aluminum oxide, other suitable insulating materials, or a combination thereof. In one embodiment of the present disclosure, the material of the first insulating layer 13 comprises silicon nitride. The second insulating layer 14 may include an organic layer, which comprises an organic material such as a resin, a polymer, a photoresist or a combination thereof. The material of the organic layer may comprise a polyacrylic resin, a polyimide resin, an epoxy resin or others. In another embodiment of the present disclosure, a refractive index of the second insulating layer 14 is substantially the same as a refractive index of the first insulating layer 13. For example, the refractive indexes of the second insulating layer 14 and the first insulating layer 13 are 1.4. In one embodiment, a difference between the refractive index of the second insulating layer 14 and the refractive index of the first insulating layer 13 can be less than 0.5. When the refractive index of the second insulating layer 14 is close to the refractive index of the first insulating layer 13, the image brightness of the electronic device can be improved. However, the present disclosure is not limited thereto.

Figure 1B:
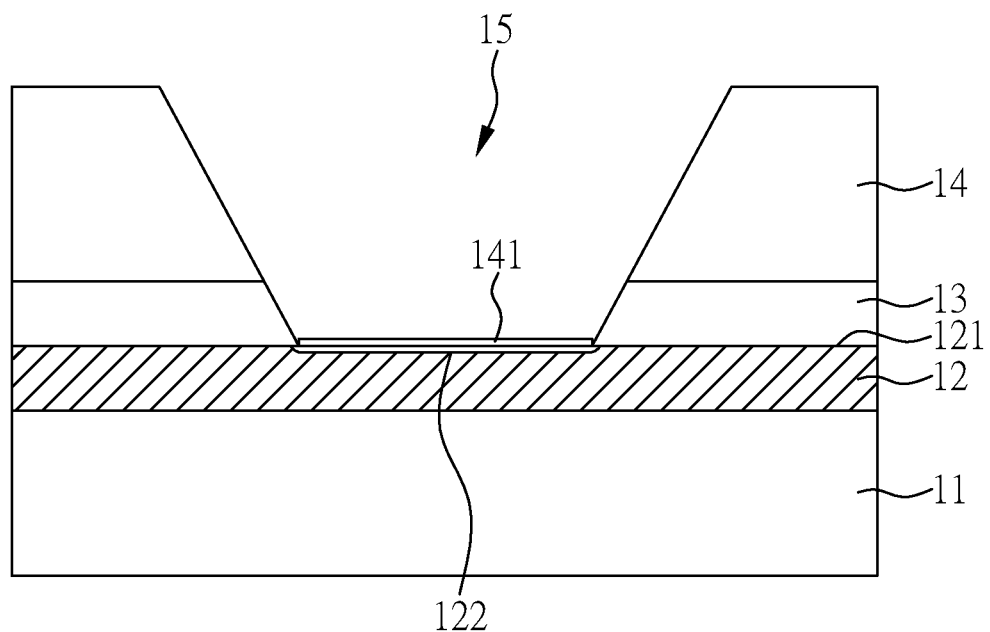

As shown in FIG. 1B, the first insulating layer 13 and the second insulating layer 14 are etched to form a contact hole 15, which exposes a portion of the first surface 121. The contact hole 15 can be formed by a dry ethcing process, a wet etching process or a combination thereof. In one embodiment of the present disclosure, the contact hole 15 is formed by a dry ethcing process. In some embodiments, the dry etching process uses an oxygen-containing plasma. After the dry etching process, an oxide layer 122 and a residue layer 141 are formed on the metal layer 12. The oxide layer 122 may comprise an oxide, such as a metal oxide, which is a product generated after the metal layer 12 is oxidized by the oxygen-containing plasma. In one embodiment of the present disclosure, the metal oxide is CuO. In addition, the residue layer 141 may comprise an organic material, which is a decomposed product of the first insulating layer 13 and/or the second insulating layer 14 generated when ions contained in the oxygen-containing plasma react with the first insulating layer 13 and/or the second insulating layer 14. The residue layer 141 may also comprise a fallen residue of the first insulating layer 13 and/or the second insulating layer 14 during the etching process. In one embodiment, the organic material comprised in the residue layer 141 may has a molecular weight equal to or smaller than a molecular weight of the organic material comprised in the second insulating layer 14.

Figure 1C:
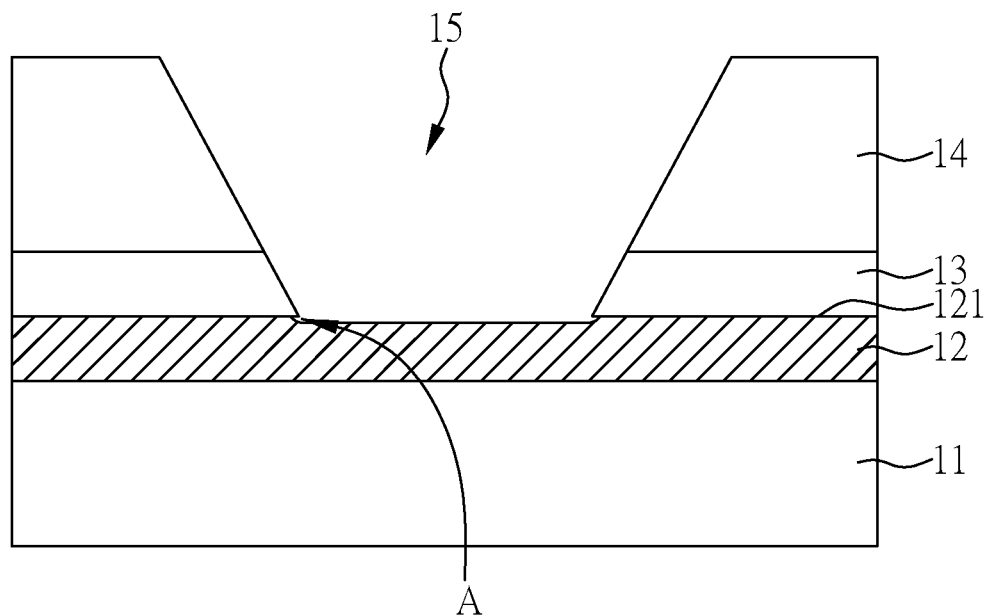

Then, the portion of the first surface 121 exposed by the contact hole 15 is cleaned with a solution to remove the residue layer 141 or the oxide layer 122 on the first surface 121 exposed by the contact hole 15, as shown in FIG. 1C. When the residue layer 141 or the oxide layer 122 in the contact hole 15 is removed, the resistance between the metal layer 12 and the sequentially-formed transparent conductive layer, which may be increased due to the presence of the residue layer 141 or the oxide layer 122, can be reduced. Or, when the residue layer 141 or the oxide layer 122 in the contact hole 15 is removed, the peeling of the transparent conductive layer sequentially formed on the metal layer 12 can be prevented and thus the sequentially-formed transparent conductive layer can electrically connect with the metal layer 12 well. Herein, the time and the temperature of the cleaning step are not particularly limited. In one embodiment of the present disclosure, the temperature of the cleaning step can be in a range from 20° C. to 40° C., and the time of the cleaning step can be in a range from 30 seconds to 3 minutes. However, the present disclosure is not limited thereto.

In one embodiment of the present disclosure, the solution for cleaning the contact hole 15 may comprise: a residue removing agent, an acid, a metal corrosion inhibitor and a solvent. The content C1 of the residue removing agent can be in a range from 28 wt % to 40 wt % (28 wt %≤C1≤40 wt %), for example, 32 wt % or 35 wt %. The content C2 of the acid can be in a range from 10 wt % to 18 wt % (10 wt %≤C2≤18 wt %), for example, 15 wt %. The content C3 of the metal corrosion inhibitor can be in a range from 8.01 wt % to 13 wt % (8.01 wt %≤C3≤13 wt %), for example, 10 wt % or 12 wt %. Herein, the residue removing agent is used to decompose the organic material comprised in the residue layer 141 into an organic acid, an alcohol or other small molecule which can be easily removed. The acid is used to provide hydrogen ions, which can react with the metal oxide (for example, CuO) to dissolve the oxide layer 122. Because the residue removing agent may also react with the metal comprised in the metal layer 12, the metal corrosion inhibitor can reduce the rate that the metal comprised in the metal layer 12 is etched by the residue removing agent.

In addition, the solution for cleaning the contact hole 15 may further comprise: an insulator removing agent, and the content C4 thereof can be in a range from 0.2 wt % to 1 wt % (0.2 wt %≤C4≤1 wt %), for example, 0.6 wt %. Herein, the insulator removing agent can remove a part of the first insulating layer 13, so the first insulating layer 13 is not protruded too much at the recess A (as shown in FIG. 1C) sequentially formed. Thus, the sequentially-formed transparent conductive layer is not easily broken. Furthermore, the rest of the solution is the solvent.

An example of the residue removing agent can be $H_2O_2$.

An example of the acid can be an organic acid. Examples of the organic acid include: formic acid, acetic acid, propionic acid, lactic acid, glycolic acid, diglycolic acid, pyruvic acid, malonic acid, butyric acid, hydroxybutyric acid, tartaric acid, succinic acid, malic acid, maleic acid, fumaric acid, valeric acid, glutaric acid, itaconic acid, adipic acid, caproic acid, citric acid, propanetricarboxylic acid, transaconitic acid, enanthic acid, caprylic acid, lauric acid, myristic acid, palmitic acid, stearic acid, oleic acid, linoleic acid, linolenic acid or a combination thereof, but are not limited thereto.

The metal corrosion inhibitor may comprise one or more metal corrosion inhibitors. In one embodiment of the present disclosure, the metal corrosion inhibitor may comprise a first metal corrosion inhibitor and a second metal corrosion inhibitor, wherein the content C31 of the first metal corrosion inhibitor may be in a range from 8 wt % to 12 wt % (8 wt %≤C31≤12 wt %), and the content C32 of the second metal corrosion inhibitor may be in a range from 0.01 wt % to 1 wt % (0.01 wt %≤C32≤1 wt %). The first metal corrosion inhibitor can be an alkanol amine or a derivative thereof. Examples of the alkanol amine or the derivative thereof comprise: ethanolamine, N-methylethanolamine, N-methyldiethanolamine, N-ethylethanolamine, N-aminoethylethanolamine, N-propylethanolamine, N-butylethanolamine, diethanolamine, triethanolamine, 1-amino-2-propanol, N-methylisopropanolamine, N-ethylisopropanolamine, N-propylisopropanolamine, 2-aminopropan-1-ol, N-methyl-2-aminopropan-1-ol, N-ethyl-2-aminopropan-1-ol, 1-aminopropan-3-ol, N-methyl-1-aminopropan-3-ol, N-ethyl-1-aminopropan-3-ol, 1-aminobutan-2-ol, N-methyl-1-aminobutan-2-ol, N-ethyl-1-aminobutan-2-ol, 2-aminobutan-1-ol, N-methyl-2-aminobutan-1-ol, N-ethyl-2-aminobutan-1-ol, 3-aminobutan-1-ol, N-methyl-3-aminobutan-1-ol, N-ethyl-3-aminobutan-1-ol, 1-aminobutan-4-ol, N-methyl-1-aminobutan-4-ol, N-ethyl-1-aminobutan-4-ol, 1-amino-2-methylpropan-2-ol, 2-amino-2-methylpropan-1-ol, 1-aminopentan-4-ol, 2-amino-4-methylpentan-1-ol, 2-aminohexan-1-ol, 3-aminoheptan-4-ol, 1-aminooctan-2-ol, 5-aminooctan-4-ol, 1-aminopropane-2,3-diol, 2-aminopropane-1,3-diol, tris(oxymethyl)aminomethane, 1,2-diaminopropan-3-ol, 1,3-diaminopropan-2-ol, 2-(2-aminoethoxy)ethanol, 2-(2-aminoethylamino)ethanol, diglycolamine or a combination thereof. Example of the second metal corrosion inhibitor can include a triazole compound such as 1H-benzotriazole, 5-methyl-1H-benzotriazole or 3-amino-1H-triazole; a tetrazole compound such as 1H-tetrazole, 5-methyl-1H-tetrazole, 5-phenyl-1H-tetrazole or 5-amino-1H-tetrazole; an imidazole compound such as 1H-imidazole or 1H-benzimidazole; a thiazole compound such as 1,3-thiazole or 4-methylthiazole; or a combination thereof, but are not limited thereto.

The insulator removing agent can be a silicon nitride removing agent. Examples of the insulator removing agent may comprise a fluoride, such as KF, NaF, $NH_4F$, $NH_4HF_2$, $H_2SiF_6$, $HBF_4$, $H_2TiF_6$, $H_2ZrF_6$ or a combination thereof, but are not limited thereto.

Examples of the solvent can be water or other suitable solvent, but are not limited thereto.

In addition, the solution for cleaning the contact hole 15 can be a weakly acidic solution. In one embodiment of the present disclosure, the solution for cleaning the contact hole 15 may have a pH value in a range from 3.5 to 6. In another embodiment of the present disclosure, the solution for cleaning the contact hole 15 may have a pH value in a range from 4 to 6. In further another embodiment of the present disclosure, the solution for cleaning the contact hole 15 may have a pH value in a range from 4.5 to 5.5. However, the present disclosure is not limited thereto.

Figure 1D:
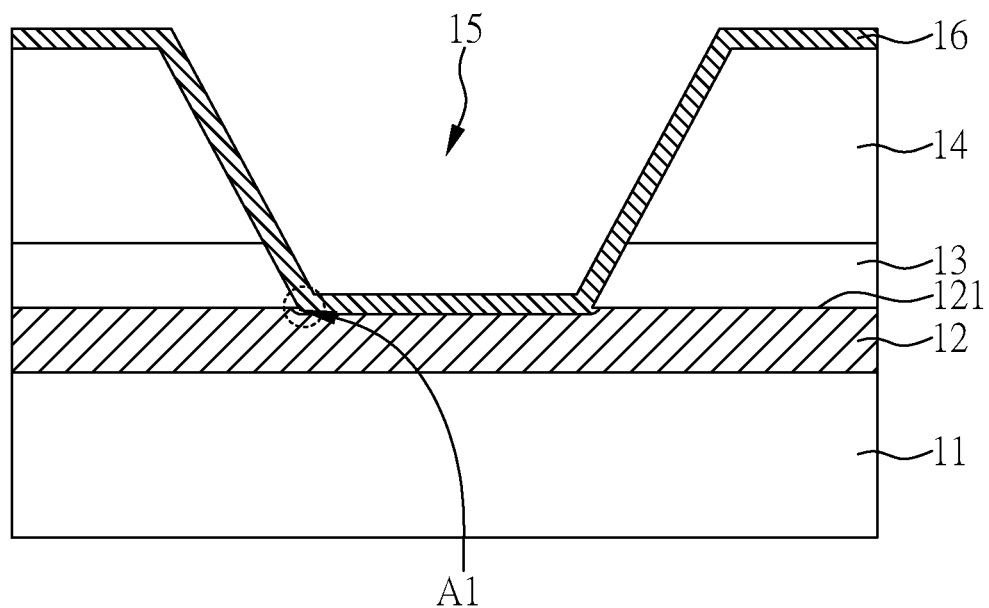

As shown in FIG. 1C, after removing the residue layer 141 or the oxide layer 122 on the first surface 121 exposed by the contact hole 15, a recess A is formed at the boundary between the metal layer 12 and the first insulating layer 13. The recess A is adjacent to the boundary between the metal layer 12 and the first insulating layer 13. For example, the recess A can be a cavity between the metal layer 12 and the first insulating layer 13, and the recess A exposes a part of a bottom surface of the first insulating layer 13. Then, as shown in FIG. 1D, a transparent conductive layer 16 is formed on the second insulating layer 14, and the transparent conductive layer 16 electrically connects with the metal layer 12. Herein, the transparent conductive layer 16 may comprise a transparent conductive metal oxide, such as indium tin oxide (ITO), indium zinc oxide (IZO), indium tin zinc oxide (ITZO), indium gallium zinc oxide (IGZO) or aluminum doped zinc oxide AZO, but is not limited thereto. After forming the transparent conductive layer 16, a part of the transparent conductive layer 16 fills into the recess A to form a filled structure Al. In one embodiment, the recess A can be filled with the transparent conductive layer 16. In another embodiment, the recess A is partially filled with the transparent conductive layer 16.

As shown in FIG. 1D, after the aforesaid steps, the electronic device of the present embodiment can be manufactured. The electronic device of the present disclosure comprises: a substrate 11, a metal layer 12, a first insulating layer 13, a second insulating layer 14, a contact hole 15, a transparent conductive layer 16 and a recess A. The metal layer 12 is disposed on the substrate 11 and has a first surface 121. The first insulating layer 13 is disposed on the first surface 121 of the metal layer 12. The second insulating layer 14 is disposed on the first insulating layer 13. The contact hole 15 penetrates through the first insulating layer 13 and the second insulating layer 14 and exposes the first surface 121 of the metal layer 12. The recess A is adjacent to the boundary between the metal layer 12 and the first insulating layer 13. The transparent conductive layer 16 is disposed on the second insulating layer 14 and electrically connects with the metal layer 12.

Figure 2:
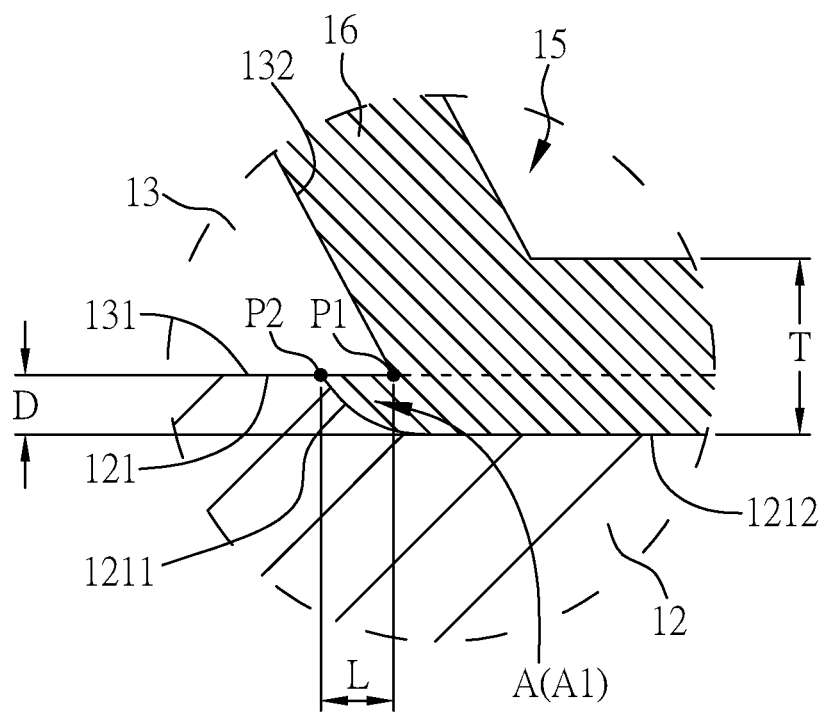
FIG. 2 is an enlarged view of a dotted circle region indicated in FIG. 1D.

FIG. 2 is an enlarged view of a dotted circle region indicated in FIG. 1D. In one embodiment, the filled structure Al is adjacent to the boundary between the metal layer 12 and the first insulating layer 13. The exposed portion of the first surface 121 includes a sidewall 1211 and a substantially flat surface 1212. The sidewall 1211 and the exposed portion of a second surface 131 (i.e. the bottom surface) of the first insulating layer 13 form the recess A. In addition, in the present embodiment, the first insulating layer 13 has a second surface 131 and a side surface 132, the second surface 131 faces to the metal layer 12, and the side surface 132 connects to the second surface 131. In a cross section of the electronic device of the present disclosure, the second surface 131 and the side surface 132 intersect at a first point P1, the second surface 131 and the sidewall 1211 intersect at a second point P2, and a distance between the first point P1 and the second point P2 is a length L of the recess A. In some embodiments, if the place that the second surface 131 and the side surface 132 intersect has a curved shape, the length L of the recess A can be a maximum distance between the second point P2 and a point on the curved shape along a normal direction of the substrate 11. In the electronic device of the present embodiment, the filled structure Al is adjacent to the boundary between the metal layer 12 and the first insulating layer 13, and a ratio of the length L of the recess A to a thickness T of the transparent conductive layer 16 can be in a range from 0.01 to 0.2 (0.01≤L/T≤0.2). The length L of the recess A can be in a range from 0.01 nm to 100 nm (0.01 nm≤L≤100 nm). The thickness T of the transparent conductive layer 16 can be in a range from 400 nm to 2000 nm (400 nm≤T≤2000 nm). In some embodiments, the length L or the thickness T can be a value obtained by a measurement at single position, or an average value obtained by averaging measurements at plural positions. For example, the position for measuring the thickness T can be at a central region of the bottom of the contact hole 15, and the thickness T is a thickness of the transparent conductive layer 16 measured along the normal direction of the substrate 11. When the length L of the recess A is within the aforesaid range or the ratio of the length L of the recess A to the thickness T of the transparent conductive layer 16 is within the aforesaid range, the coverage of the transparent conductive layer 16 is good and the problem that the transparent conductive layer 16 is broken can be prevented. However, when the length L of the recess A or the ratio of the length L of the recess A to the thickness T of the transparent conductive layer 16 exceeds the upper limit of the aforesaid range, the transparent conductive layer 16 may have a problem of poor coverage and then may be broken.

For example, the length L of the recess A, the thickness T of the transparent conductive layer 16 and the ratio of the length L to the thickness T can be listed in the following Table 1, but are not limited thereto.

TABLE 1

| Length L (nm) | Thickness T (nm) | L/T |
|---|---|---|
| 10 | 600 | 0.017 |
| 10 | 800 | 0.013 |
| 18 | 600 | 0.03 |
| 18 | 800 | 0.023 |
| 40 | 600 | 0.067 |
| 40 | 800 | 0.05 |
| 100 | 600 | 0.167 |
| 100 | 800 | 0.125 |
| 100 | 1400 | 0.071 |

In the electronic device of the present disclosure, as shown in FIG. 2, a distance between the second point P2 and the surface 1212 along the normal direction of the substrate 11 is defined as a depth D of the recess A. The depth D of the recess A can be in a range from 20 nm to 100 nm (20 nm≤D≤100 nm), for example, 40 nm or 60 nm. In one embodiment, the depth D can be a value obtained by a measurement at single position, or an average value obtained by averaging measurements at plural positions. When the depth D is within the aforesaid range, a continuous transparent conductive layer 16 can be easily formed. However, when the depth D exceeds the upper limit of the aforesaid range, the coverage of the transparent conductive layer 16 may be not good enough and the problem that the transparent conductive layer 16 is broken may be occurred.

The electronic device provided by the present embodiment can be applied to a display device comprising a display layer, wherein the display layer may comprise: liquid crystals (LCs), organic light-emitting diodes (OLEDs), quantum dots (QDs), fluorescence materials, phosphorsm light-emitting diodes (LEDs), micro light-emitting diodes, mini light-emitting diodes or other display medium. When the display medium of the display device is changed, the structure of the display device can be adjusted as appropriate. However, the present disclosure is not limited thereto.

When the electronic device of the present disclosure is a display device, the display device can be integrated with a touch panel to form a touch display device. Meanwhile, the display device of the present disclosure may be applied to any electronic devices that need to display images, such as displays, mobile phones, laptops, video cameras, still cameras, music players, mobile navigators, TV sets, and other electronic devices.

Although the present disclosure has been explained in relation to its embodiment, it is to be understood that many other possible modifications and variations can be made without departing from the spirit and scope of the disclosure as hereinafter claimed.

What is claimed is:

1. A method for manufacturing an electronic device, comprising the following steps:
   providing a substrate;
   forming a metal layer on the substrate, wherein the metal layer has a first surface;
   forming a first insulating layer on the first surface of the metal layer;
   forming a second insulating layer on the first insulating layer;
   etching the first insulating layer and the second insulating layer to form a contact hole, wherein the contact hole exposes a portion of the first surface;
   cleaning the portion of the first surface exposed by the contact hole with a solution, wherein a recess is formed at a boundary between the metal layer and the first insulating layer; and
   forming a transparent conductive layer on the second insulating layer, wherein the transparent conductive layer electrically connects with the metal layer;
   wherein the recess connects with the contact hole.

2. The method of claim 1, wherein the step of cleaning the portion of the first surface exposed by the contact hole with the solution includes: removing a residue or an oxide on the portion of the first surface exposed by the contact hole.

3. The method of claim 1, wherein the second insulating layer includes an organic layer.

4. The method of claim 1, wherein the metal layer comprises Cu or Cu alloy.

5. The method of claim 1, wherein the first insulating layer comprises silicon nitride.

6. The method of claim 1, wherein a refractive index of the second insulating layer is substantially the same as a refractive index of the first insulating layer.

7. The method of claim 1, wherein a ratio of a length of the recess to a thickness of the transparent conductive layer is in a range from 0.01 to 0.2.

8. The method of claim wherein a length of the recess is in a range from 0.01 nm to 100 nm.

9. The method of claim 1, wherein a thickness of the transparent conductive layer is in a range from 400 nm to 2000 nm.

10. The method of claim 1, wherein a depth of the recess is in a range from 20 nm to 100 nm.

11. The method of claim 1, wherein the step of etching the first insulating layer and the second insulating layer to form the contact hole is performed by a dry etching process.

* * * * *